(12) United States Patent
Bhattacharyya et al.

(10) Patent No.: US 11,047,806 B2
(45) Date of Patent: Jun. 29, 2021

(54) DEFECT DISCOVERY AND RECIPE OPTIMIZATION FOR INSPECTION OF THREE-DIMENSIONAL SEMICONDUCTOR STRUCTURES

(71) Applicant: KLA-Tencor Corporation, Milpitas, CA (US)

(72) Inventors: Santosh Bhattacharyya, San Jose, CA (US); Devashish Sharma, San Jose, CA (US); Christopher Maher, San Jose, CA (US); Bo Hua, Shanghai (CN); Philip Measor, San Jose, CA (US); Robert M. Danen, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 290 days.

(21) Appl. No.: 15/826,019

(22) Filed: Nov. 29, 2017

(65) Prior Publication Data
US 2018/0149603 A1   May 31, 2018

Related U.S. Application Data

(60) Provisional application No. 62/427,917, filed on Nov. 30, 2016, provisional application No. 62/427,973, filed on Nov. 30, 2016.

(51) Int. Cl.
*G06K 9/00* (2006.01)
*G01N 21/95* (2006.01)
(Continued)

(52) U.S. Cl.
CPC ....... *G01N 21/9505* (2013.01); *G01N 21/956* (2013.01); *G01N 23/04* (2013.01);
(Continued)

(58) Field of Classification Search
None
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

OTHER PUBLICATIONS

Arceo, Abraham et al., "Use of TSOM for sub-11 nm node pattern defect detection and HAR features," Proc. of SPIE, vol. 8681, Metrology, Inspection, and Process Control for Microlithography XXVII, 86812G (2013).

(Continued)

*Primary Examiner* — Sean M Conner
(74) *Attorney, Agent, or Firm* — Spano Law Group; Joseph S. Spano

(57) ABSTRACT

Methods and systems for discovery of defects of interest (DOI) buried within three dimensional semiconductor structures and recipe optimization are described herein. The volume of a semiconductor wafer subject to defect discovery and verification is reduced by storing images associated with a subset of the total depth of the semiconductor structures under measurement. Image patches associated with defect locations at one or more focus planes or focus ranges are recorded. The number of optical modes under consideration is reduced based on any of a comparison of one or more measured wafer level defect signatures and one or more expected wafer level defect signatures, measured defect signal to noise ratio, and defects verified without de-processing. Furthermore, verified defects and recorded images are employed to train a nuisance filter and optimize the measurement recipe. The trained nuisance filter is applied to defect images to select the optimal optical mode for production.

26 Claims, 5 Drawing Sheets

(51) Int. Cl.
*G01R 31/311* (2006.01)
*G01N 21/956* (2006.01)
*G01N 23/04* (2018.01)
*G01R 31/28* (2006.01)
*G06T 7/00* (2017.01)
*G01N 21/88* (2006.01)

(52) U.S. Cl.
CPC ........ G01R 31/2831 (2013.01); G01R 31/311 (2013.01); G06T 7/001 (2013.01); *G01N 2021/8883* (2013.01); *G01N 2223/6462* (2013.01); *G06T 2207/10061* (2013.01); *G06T 2207/20081* (2013.01); *G06T 2207/20084* (2013.01); *G06T 2207/30148* (2013.01)

(56) References Cited

U.S. PATENT DOCUMENTS

| | | | |
|---|---|---|---|
| 6,201,601 | B1 | 3/2001 | Vaez-Iravani et al. |
| 6,208,411 | B1 | 3/2001 | Vaez-Iravani |
| 6,271,916 | B1 | 8/2001 | Marxer et al. |
| 6,429,943 | B1 | 8/2002 | Opsal et al. |
| 6,842,021 | B1* | 1/2005 | Weaver ............ G01N 21/95684 324/754.23 |
| 7,130,039 | B2 | 10/2006 | Vaez-Iravani et al. |
| 7,295,303 | B1 | 11/2007 | Vaez-Iravani et al. |
| 7,478,019 | B2 | 1/2009 | Zangooie et al. |
| 7,777,876 | B2 | 8/2010 | Horai et al. |
| 7,933,026 | B2 | 4/2011 | Opsal et al. |
| 8,912,495 | B2 | 12/2014 | Lange |
| 9,007,581 | B2 | 4/2015 | Horai et al. |
| 9,075,027 | B2 | 7/2015 | Lange |
| 2004/0105099 | A1 | 6/2004 | Nikoonahad |
| 2006/0265145 | A1* | 11/2006 | Huet ................. G01R 31/2846 702/35 |
| 2007/0288219 | A1* | 12/2007 | Zafar ....................... G03F 1/84 703/14 |
| 2009/0070055 | A1* | 3/2009 | Long ...................... H01L 22/12 702/81 |
| 2014/0111791 | A1 | 4/2014 | Manassen et al. |
| 2014/0133737 | A1* | 5/2014 | Plihal ................... G06T 7/0004 382/149 |
| 2014/0139830 | A1 | 5/2014 | Lange |
| 2014/0172394 | A1 | 6/2014 | Kuznetsov et al. |
| 2014/0222380 | A1 | 8/2014 | Kuznetsov et al. |
| 2014/0268117 | A1 | 9/2014 | Kolchin et al. |
| 2014/0300890 | A1 | 10/2014 | Lange et al. |
| 2014/0307052 | A1* | 10/2014 | Ahn .................. G01N 21/9505 348/46 |
| 2015/0226676 | A1 | 8/2015 | Nicolaides |
| 2015/0233840 | A1* | 8/2015 | Amanullah ........ G01N 21/8806 348/46 |
| 2016/0123894 | A1 | 5/2016 | Fu |
| 2016/0123898 | A1* | 5/2016 | Chen .................. G01N 21/9501 |
| 2016/0209334 | A1 | 7/2016 | Chen et al. |
| 2016/0305892 | A1* | 10/2016 | Tsuchiya .............. G01N 21/956 |
| 2019/0094155 | A1* | 3/2019 | Honda .................... H01L 22/10 |

OTHER PUBLICATIONS

Attota, Ravikiran et al., "Optimizing noise for defect analysis with through-focus scanning optical microscopy," Proc. of SPIE, vol. 9778, Metrology, Inspection, and Process Control for Microlithography XXX, 977811, Mar. 8, 2016.

Attota, Ravikiran et al., "Through-Focus Scanning Optical Microscopy," Proc. of SPIE, vol. 8036, Scanning Microscopies 2011: Advanced Microscopy Technologies for Defense, Homeland Security, Forensic, Life, Environmental, and Industrial Sciences, 803610, Jun. 1, 2011.

International Search Report dated Feb. 26, 2018, for PCT Application No. PCT/US2017/064040 filed Nov. 30, 2017 by KLA-Tencor Corporation, 4 pages.

* cited by examiner

DEFECT DISCOVERY AND RECIPE OPTIMIZATION FOR INSPECTION OF THREE-DIMENSIONAL SEMICONDUCTOR STRUCTURES

CROSS REFERENCE TO RELATED APPLICATION

The present application for patent claims priority under 35 U.S.C. § 119 from U.S. provisional patent application Ser. No. 62/427,973, filed Nov. 30, 2016, and from U.S. provisional patent application Ser. No. 62/427,917, filed Nov. 30, 2016. The subject matter of each provisional application is incorporated herein by reference in its entirety.

TECHNICAL FIELD

The described embodiments relate to systems for specimen inspection, and more particularly to semiconductor wafer inspection modalities.

BACKGROUND INFORMATION

Semiconductor devices such as logic and memory devices are typically fabricated by a sequence of processing steps applied to a substrate or wafer. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Inspection processes are used at various steps during a semiconductor manufacturing process to detect defects on wafers to promote higher yield. As design rules and process windows continue to shrink in size, inspection systems are required to capture a wider range of physical defects while maintaining high throughput.

Inspection systems such as unpatterned wafer inspection systems and patterned wafer inspection systems illuminate and inspect a wafer for undesired defects. As semiconductor design rules continue to evolve, the minimum defect size that must be detected continues to shrink in size.

In addition, memory architectures are transitioning from two dimensional floating-gate architectures to fully three dimensional geometries. In some examples, film stacks and etched structures are very deep (e.g., up to six micrometers in depth, or more). Such high aspect ratio structures create challenges for patterned wafer inspection. The ability to measure defects buried within these structures is critical to achieve desired performance levels and device yield.

In some examples, electronic tests are employed to detect defects buried within three dimensional structures. However, multiple device layers must be fabricated before electronic tests are performed. Thus, defects cannot be detected early in the production cycle. As a result, electronic tests are prohibitively expensive to perform, particularly during research and development and ramp phases of the production process, where rapid assessment of defects is critical.

In some other examples, defects buried within three dimensional structures can be detected based on x-ray based measurement techniques. For example, an x-ray diffractive measurement system or a coherent x-ray imaging system may be employed to detect buried defects. X-ray based measurement techniques have the advantage of being non-destructive, but throughput remains quite low.

In some other examples, electron beam inspection (EBI) is employed directly to detect defects buried within three dimensional structures. However, EBI is extremely limited in its ability to detect defects beyond a depth of approximately one micrometer. In many examples, EBI is limited to depths that are far less than one micrometer (e.g., less than fifty nanometers). This limitation is due to practical limits on electron dosage before sample distortion or destruction occurs. Thus, EBI is limited in its effectiveness as a defect detection tool for thick, three dimensional structures.

Some traditional optical inspection techniques have proven effective for the detection of defects buried within three dimensional structures. In one example, confocal optical inspection is employed at different depths of focus. Confocal imaging eliminates spurious or nuisance optical signals from structures above and below the focal plane. The confocal optical inspection technique is described in further detail in U.S. Patent Publication No. 2014/0300890, which is incorporated herein by reference in its entirety. In another example, a rotating illumination beam is employed to detect buried defects in relatively thick layers. Optical inspection utilizing a rotating illumination beam is described in further detail in U.S. Patent Publication No. 2014/0268117, which is incorporated herein by reference in its entirety. In another example, different illumination wavelength ranges are employed to detect buried defects as described in further detail in U.S. Pat. No. 9,075,027, which is incorporated herein by reference it its entirety. In yet another example, multiple discrete spectral bands are employed to detect buried defects as described in further detail in U.S. Pat. No. 8,912,495, which is incorporated herein by reference it its entirety.

Traditionally, defect discovery and inspection recipe optimization are based on the inspection of planar, two-dimensional structures. An optical inspection tool is employed to measure a large number of defects of interest (DOI) associated with two dimensional structures (e.g., less than one micrometer thick) located at the surface of the wafer. The DOI detected by the optical inspection tool are verified by inspecting the identified DOI with a scanning electron microscopy (SEM) tool. This is commonly referred to as SEM review. The SEM tool is able to accurately classify the DOI as either real DOI or nuisance defects (i.e., defects identified by the optical inspection tool that are not really defects). Based on SEM review, an inspection recipe for the optical inspection tool is formulated that maximizes the capture rate of real DOI and minimizes the capture rate of nuisance defects. In traditional practice, defect discovery and recipe optimization involves iteration between optical inspection of the wafer and SEM review to converge on a desired measurement recipe. For two dimensional structures, this iterative approach to defect discovery and recipe development for an optical inspection tool is reasonably effective and time efficient. However, for the inspection of three-dimensional structures, the traditional approach to defect discovery and recipe development is overly time consuming and impractical.

SEM has a very limited penetration depth. Thus, SEM review is only effective for the measurement of defects at or very near the surface of the structure under inspection. To verify defects buried within three dimensional structures, the wafer must be de-processed to uncover the buried defects. Wafer de-processing is time consuming and destroys the wafer by removing layers to reveal DOI detected by the optical inspection tool. Thus, it is not practical to iterate between optical inspection and SEM review to discover defects and optimize the measurement recipe, as is common with the inspection of two-dimensional structures.

Furthermore, the number of available modes that must be considered for optical inspection of three dimensional structures is much larger than for optical inspection of two dimensional structures because detecting defects of buried structures is much more difficult and depends heavily on the structure itself. Moreover, optical inspection of three dimensional structures is based on through focus measurements (i.e., three dimensional images collected at multiple depths through the structure) that involve large amounts of data. Storing and processing excessively large numbers of three dimensional images is impractical.

Although optical inspection techniques have emerged that are useful for detecting possible defects buried within three dimensional structures, existing defect discovery and recipe optimization techniques have proven to be impractical for measurement applications involving three dimensional structures. Improvements to defect discovery and recipe optimization for optical inspection systems with application to vertical semiconductor devices, such as 3D memory, VNAND memory, or other vertical structures, are desired.

SUMMARY

Methods and systems for improved detection and classification of defects of interest (DOI) buried within three dimensional semiconductor structures are described herein. In particular, methods and systems for defect discovery and measurement recipe optimization with and without defect verification are described herein.

In one aspect, the three dimensional volume of a semiconductor wafer subject to defect discovery and verification is reduced by storing images associated with a subset of the total depth of the semiconductor structures under measurement. In this manner, the amount of image data that must be collected and analyzed as part of the measurement recipe optimization process is reduced.

After determining one or more focus planes or a focus range, an inspection system records image patches associated with defect locations at the one or more focus planes or focus range, rather than throughout the entire depth of the structure. In this manner, the amount of recorded data associated with defect discovery is limited to a subset of depths. The recorded data are employed during subsequent defect verification and recipe optimization processes. By limiting the amount of recorded data, subsequent defect verification and recipe optimization processes are dramatically simplified.

In a further aspect, the number of optical modes under consideration is reduced based on a comparison of one or more measured wafer level defect signatures and one or more expected wafer level defect signatures. In one example, a wafer level defect signature is a wafer defect map that illustrates regions of the wafer area where defects are more highly or less highly concentrated. In general, a wafer level defect signature includes any indication of wafer defects expressed across the entire wafer area under inspection.

In another further aspect, the number of optical modes under consideration is reduced based on measured defect signal to noise ratio. In one example, the signal to noise ratio associated with each selected optical mode is analyzed at one or more focus planes or focus levels. The optical modes with the highest signal to noise ratio are selected for further consideration, and the other optical modes are discarded.

In another further aspect, the number of optical modes under consideration is reduced based on SEM review of defects without de-processing. In one example, SEM review measurements are performed to verify defects of interest at the surface or even slightly below the surface. In one example, high energy SEM is utilized to review defects buried within a structure under consideration. Defects verified by SEM review are compared to optical inspection results and the optical modes with the highest capture rates of verified defects, and the fewest capture rate of nuisance defects, are selected for further consideration.

In another aspect, verified defect images/features are mapped to corresponding defects identified by optical inspection. The verified defects and the recorded three dimensional images are employed to train a nuisance filter and optimize the measurement recipe.

In some examples, defect information associated with defects identified by optical inspection is sampled to generate a diversity set of defects of interest (DOIs). In some examples, the defects are binned and a few defects are selected from each bin to generate the diversity set of DOIs. Defect verification measurements are performed on the diversity set of DOIs. Defect verification data from the diversity set of DOIs, any other set of verified defects, or a combination thereof, are mapped to the saved through focus defect image patches and corresponding feature vectors. The defect verification data and the corresponding through focus defect image patches and corresponding feature vectors are employed to train a nuisance elimination filter.

The trained nuisance elimination filter is applied to defect images associated with each optics mode under consideration. In this manner, defect detection is emulated using the through focus defect events recorded during defect discovery. Detection threshold values associated with each optical mode are adjusted to achieve a desirable nuisance rate. The optical mode that achieves the best defect signature matching and real defect capture rate is selected for implementation as the production measurement recipe for the measurement application under consideration.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for improved detection and classification of defects of interest (DOI) buried within three dimensional semiconductor structures are described herein. In particular, methods and systems for defect discovery and measurement recipe optimization with and without defect verification are described herein. Optical inspection of thick, layered structures reveals DOIs at multiple depths through the structures under inspection at high throughput. Three dimensional optical inspection captures signal propagation within the wafer, and thus is able to differentiate real DOIs from nuisance and noise, even for relatively thick samples (e.g., 3D NAND wafers with a layered structure thicker than three micrometers). In this manner, defect discovery and preliminary classification is performed by the 3-D optical inspection tool itself before defect verification. By reducing the amount of defect data subject to verification, the time required to optimize a measurement recipe for a three dimensional inspection application is significantly reduced.

Figure 1:
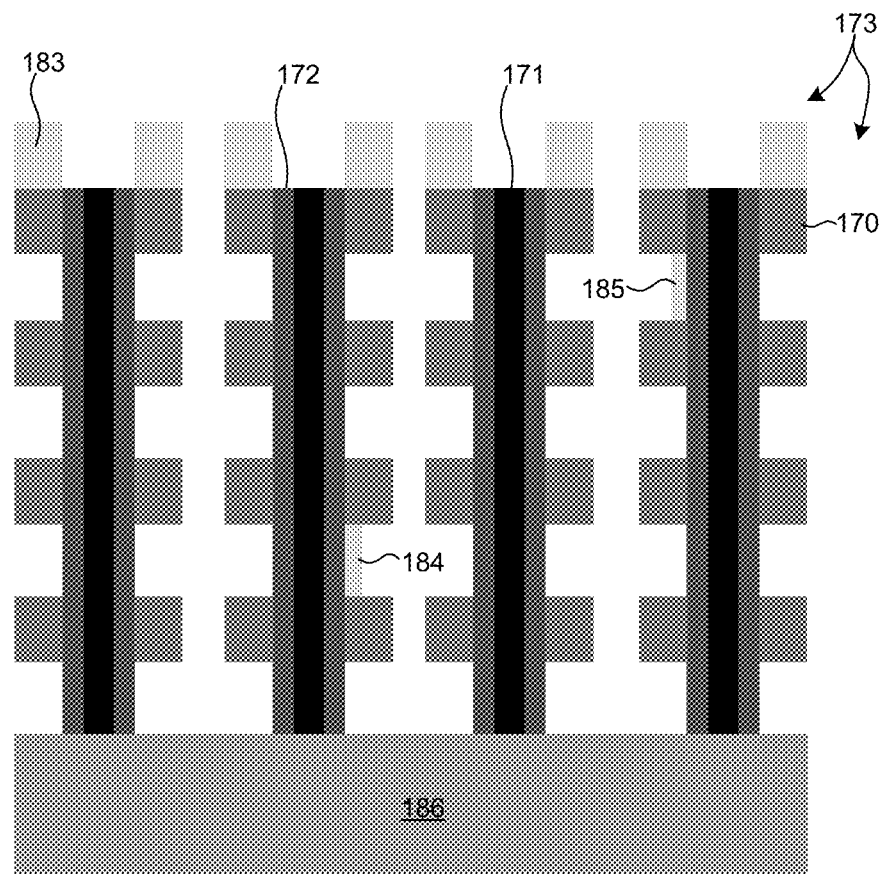
FIG. 1 depicts an illustration of a 3D NAND structure 160 at the silicon nitride removal step of the wafer production process.

FIG. 1 depicts a simplified illustration of a 3D NAND structure 160 at the silicon nitride (e.g., SiN or Si3N4) removal step of the wafer production process. FIG. 1 is depicted for illustration purposes. A manufactured 3D NAND structure includes additional features and elements. In one example, a manufactured 3D NAND structure includes many additional layers and some of the depicted structures (e.g., structure 182) include additional materials. Polysilicon structures 182 surrounding oxide core structures 181 extend vertically (e.g., normal to the surface of substrate 186) in the multi-layer 3D NAND structure. Layers of Silicon oxide 180 are spaced apart from one another by layers of Silicon nitride (not shown) that are subsequently etched away. Silicon nitride layer 183 is not etched away for purposes of illustration in FIG. 1. The next step in the process is to grow tungsten in the space between the silicon oxide layers. However, as illustrated in FIG. 1, incomplete etching has left behind silicon nitride defects 184 and 185. The electronic device will not function with defects 184 and 185. Thus, it is important to measure this defect as early as possible in the fabrication process to prevent loss of time and resources associated with further processing of a device that is destined to fail.

As depicted in FIG. 1, many DOI occur at different depths of the 3D NAND structure. Furthermore, it is challenging to separate defects that occur near the surface of the wafer from defects that occur near the bottom of the structure.

Figure 2:
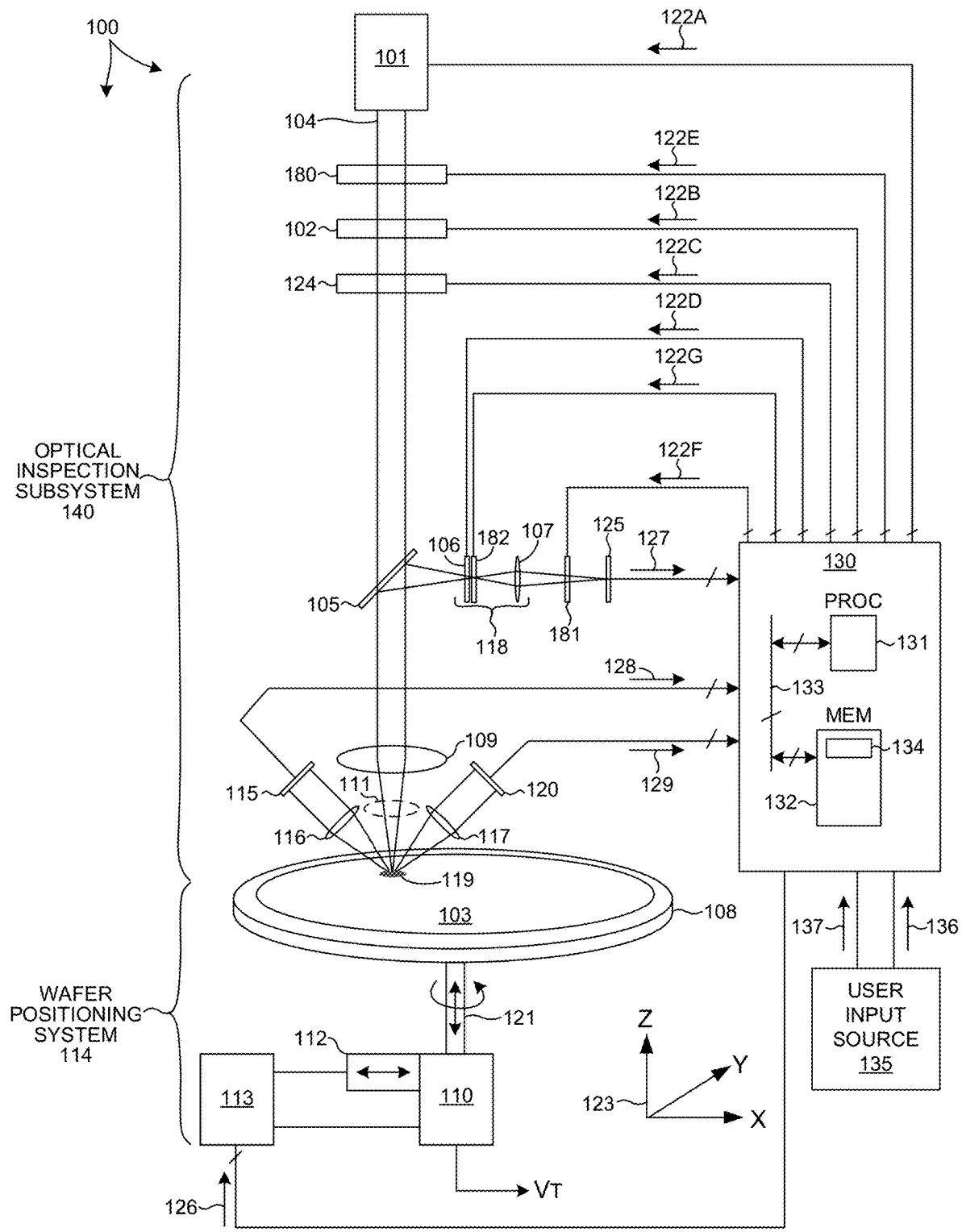
FIG. 2 is a simplified schematic view of one embodiment of an optical inspection system 100 configured to perform discovery of defects of interest (DOI) on semiconductor wafers based on three-dimensional images.

FIG. 2 is a simplified schematic view of one embodiment of an optical inspection system 100 configured to detect and classify defects of interest (DOI) of semiconductor structures. Optical inspection system 100 includes a computing system, a wafer positioning system, and an optical inspection subsystem including an illumination subsystem, a collection subsystem, and one or more detectors. The illumination subsystem includes an illumination source 101 and all optical elements in the illumination optical path from the illumination source to the wafer. The collection subsystem includes all optical elements in the collection optical path from the specimen to each detector. For simplification, some optical components of the system have been omitted. By way of example, folding mirrors, polarizers, beam forming optics, additional light sources, additional collectors, and detectors may also be included. All such variations are within the scope of the invention described herein. The inspection system described herein may be used for inspecting patterned and unpatterned wafers and reticles.

As illustrated in FIG. 2, a wafer 103 is illuminated by a normal incidence beam 104 generated by one or more illumination sources 101. Alternatively, the illumination subsystem may be configured to direct the beam of light to the specimen at an oblique angle of incidence. In some embodiments, system 100 may be configured to direct multiple beams of light to the specimen such as an oblique incidence beam of light and a normal incidence beam of light. The multiple beams of light may be directed to the specimen substantially simultaneously or sequentially.

Illumination source 101 may include, by way of example, a broad band laser sustained plasma light source, a laser, a supercontinuum laser, a diode laser, a helium neon laser, an argon laser, a solid state laser, a diode pumped solid state (DPSS) laser, a xenon arc lamp, a gas discharging lamp, an LED array, and an incandescent lamp. The light source may be configured to emit near monochromatic light or broadband light. In some embodiments, the illumination subsystem may also include one or more spectral filters that may limit the wavelength of the light directed to the specimen. The one or more spectral filters may be bandpass filters and/or edge filters and/or notch filters. Illumination may be provided to the specimen over any suitable range of wavelengths. In some examples, the illumination light includes wavelengths ranging from 260 nanometers to 950 nanometers. In some examples, illumination light includes wavelengths greater than 950 nanometers (e.g., extending to 2,500 nanometers) to capture defects in high aspect ratio structures. In some embodiments, the illumination subsystem may also include one or more polarization optics to control the polarization of illumination light directed to the specimen.

Beam 104 generated by illumination source 101 is directed to a beam splitter 105. Beam splitter 105 directs the beam to objective lens 109. Objective lens 109 focuses the beam 111 onto wafer 103 at incident spot 119. Incident spot 119 is defined (i.e., shaped and sized) by the projection of light emitted from illumination source 101 onto the surface of wafer 103.

The inspection system 100 includes illumination aperture 124. As depicted in FIG. 2, computing system 130 communicates command signal 122C to illumination aperture 124. In response, illumination aperture 124 adjusts the illumination direction and beam shape provided onto the surface of the wafer 103. In one embodiment the illumination aperture 124 is an assembly that provides varied aperture shapes controlled by command signal 122C communicated from computing system 130.

As depicted in FIG. 2, computing system 130 communicates command signal 122A to illumination source 101. In response, illumination source 101 adjusts the spectral range (s) of the illumination beam 111. In general, the beam 111 that is incident on wafer 103 may differ from the light emitted by illumination source 101 in one or more ways, including polarization, intensity, size and shape, etc.

In the embodiment depicted in FIG. 2, inspection system 100 includes selectable illumination polarization elements 180. In one example, computing system 130 communicates command signal 122E to illumination polarization elements 180. In response, illumination polarization elements 180 adjust the polarization of the illumination light provided onto the surface of the wafer 103.

As depicted in FIG. 2, inspection system 100 includes an illumination power attenuator 102 that controls the illumination power delivered to wafer 103. In some other embodiments, the illumination power density attenuator is a beam shaping element that resizes the illumination spot 119 to reduce the illumination power density delivered to wafer 103. In some other embodiments, a combination of illumination power reduction and beam sizing is employed to reduce the illumination power density delivered to wafer 103. As depicted in FIG. 2, computing system 130 communicates a control signal to illumination power attenuator 102 to control illumination power based on the three dimensional images detected by any of detectors 115, 120, and 125. In general, illumination power attenuator 102 is optional. Thus, in some other embodiments, inspection system 100 does not include illumination power attenuator 102.

In some embodiments, system 100 may include a deflector (not shown) in the illumination path. In one embodiment, the deflector may be an acousto-optical deflector (AOD). In other embodiments, the deflector may include a mechanical scanning assembly, an electronic scanner, a rotating mirror, a polygon based scanner, a resonant scanner, a piezoelectric scanner, a galvo mirror, or a galvanometer. The deflector scans the light beam over the specimen. In some embodiments, the deflector may scan the light beam over the specimen at an approximately constant scanning speed.

System 100 includes collection optics 116, 117, and 118 to collect the light scattered and/or reflected by wafer 103 and focus that light onto detector arrays 115, 120, and 125, respectively. The outputs 128, 129, and 127 of detectors 115, 120, and 125, respectively, are communicated to computing system 130 for processing the signals and determining the presence of defects and their locations.

Any of collection optics 116-118 may be a lens, a compound lens, or any appropriate lens known in the art. Alternatively, any of collection optics 116-118 may be a reflective or partially reflective optical component, such as a mirror. In addition, although particular collection angles are illustrated in FIG. 2, it is to be understood that the collection optics may be arranged at any appropriate collection angle. The collection angle may vary depending upon, for example, the angle of incidence and/or topographical characteristics of the specimen.

Each of detectors 115, 120, and 125 generally function to convert the reflected and scattered light into an electrical signal, and therefore, may include substantially any photodetector known in the art. However, a particular detector may be selected for use within one or more embodiments of the invention based on desired performance characteristics of the detector, the type of specimen to be inspected, and the configuration of the illumination. For example, if the amount of light available for inspection is relatively low, an efficiency enhancing detector such as a time delay integration (TDI) camera may increase the signal-to-noise ratio and throughput of the system. However, other detectors such as charge-coupled device (CCD) cameras, photodiodes, phototubes and photomultiplier tubes (PMTS) may be used, depending on the amount of light available for inspection and the type of inspection being performed. In at least one embodiment of the invention, a photomultiplier tube is used for detecting light scattered from a specimen. Each detector may include only one sensing area, or possibly several sensing areas (e.g., a detector array or multi-anode PMT).

System 100 can use various imaging modes, such as bright field and dark field modes. For example, in one embodiment, detector 125 generates a bright field image. As illustrated in FIG. 2, some amount of light scattered from the surface of wafer 103 at a narrow angle is collected by objective lens 109. This light passes back through objective lens 109 and impinges on beam splitter 105. Beam splitter 105 transmits a portion of the light to collection optics 118, which in turn focuses the light onto detector 125. In this manner a bright field image is generated by detector array 125. Collection optics 118 includes imaging lens 107 that images the reflected light collected by objective lens 109 onto detector array 125. An aperture 182, Fourier filter 106, or both are placed at the back focal plane of objective lens 109. Various imaging modes such as bright field, dark field, and phase contrast can be implemented by using different illumination apertures 124, collection apertures, Fourier filters 106, or combinations thereof. The configuration of the imaging mode, such as illumination direction or imaging collection solid angle, can be determined based on DOI signal and three-dimensional images. U.S. Pat. Nos. 7,295,303 and 7,130,039, which are incorporated by reference herein, describe these imaging modes in further detail. In another example, detectors 115 and 120 generate dark field images by imaging scattered light collected at larger field angles. U.S. Pat. No. 6,208,411, which is incorporated by reference herein, describes these imaging modes in further detail.

In the embodiment depicted in FIG. 2, inspection system 100 includes selectable collection polarization elements 181. In one example, computing system 130 communicates command signal 122F to collection polarization elements 181. In response, collection polarization elements 181 adjust the polarization of the collected light provided onto the surface of detector 125.

As depicted in FIG. 2, inspection system 100 includes a selectable Fourier filter 106. Computing system 130 communicates command signals 122D to Fourier filter 106. In response, Fourier filter 106 adjusts the Fourier filtering properties of the Fourier filter (e.g., by changing the specific Fourier filter elements located in the collection beam path).

The inspection system 100 includes collection aperture 182. As depicted in FIG. 2, computing system 130 communicates command signal 122G to collection aperture 182. In response, collection aperture 182 adjusts the amount of light collected from the surface of the wafer 103 that is transmitted to the corresponding detector. In one embodiment the collection aperture 182 is an assembly that provides varied aperture shapes controlled by command signal 122G communicated from computing system 130.

System 100 also includes various electronic components (not shown) needed for processing the reflected and/or scattered signals detected by any of detectors 115, 120, and 125. For example, system 100 may include amplifier circuitry to receive output signals from any of detectors 115, 120, and 125 and to amplify those output signals by a predetermined amount and an analog-to-digital converter (ADC) to convert the amplified signals into a digital format suitable for use within processor 131. In one embodiment, the processor may be coupled directly to an ADC by a transmission medium. Alternatively, the processor may receive signals from other electronic components coupled to the ADC. In this manner, the processor may be indirectly coupled to the ADC by a transmission medium and any intervening electronic components.

In the embodiment illustrated in FIG. 2, wafer positioning system 114 moves wafer 103 under beam 111 based on commands 126 received from computing system 130. Wafer positioning system 114 includes a wafer chuck 108, motion controller 113, a rotation stage 110, translation stage 112, and z-translation stage 121. Z-translation stage 121 is configured to move wafer 103 in a direction normal to the surface of wafer 103 (e.g., the z-direction of coordinate system 123). Translation stage 112 and rotation stage 110 are configured to move wafer 103 in a direction parallel to the surface of wafer 103 (e.g., the x and y directions of coordinate system 123). In some other embodiments, wafer 103 is moved in the in-plane directions (e.g., x and y directions) by the coordinated motion of multiple translation stages.

Wafer 103 is supported on wafer chuck 108. In some embodiments, wafer 103 is located with its geometric center approximately aligned with the axis of rotation of rotation stage 110. In this manner, rotation stage 110 spins wafer 103 about its geometric center at a specified angular velocity, ω, within an acceptable tolerance. In addition, translation stage 112 translates the wafer 103 in a direction approximately perpendicular to the axis of rotation of rotation stage 110 at a specified velocity, $V_T$. Motion controller 113 coordinates the spinning of wafer 103 by rotation stage 110 and the translation of wafer 103 by translation stage 112 to achieve a desired in-plane scanning motion of wafer 103 within inspection system 100. In addition, motion controller 113 coordinates the movement of wafer 103 by translation stage 121 to achieve a desired out-of-plane scanning motion of wafer 103 within inspection system 100.

Wafer 103 may be positioned relative to the optical subsystems of inspection system 100 in a number of different modes. In an inspection mode, wafer 103 is repeatedly scanned in the lateral directions (e.g., x-direction and y-direction) at each different z-position. In some examples, wafer 103 is scanned at two or more different z-positions, corresponding to two or more depths (e.g., distance below wafer surface) through a layered structure. In a defect review mode, wafer 103 is positioned in a fixed position in the x-direction and y-directions, while scanning in the z-direction. In this manner, three dimensional images are generated based on measurement data at a fixed lateral position of wafer 103 over a range of depths within the structure under measurement. Defect review mode is typically employed to perform more detailed investigation of defects (e.g., higher image resolution, higher focal depth resolution, or both).

In some embodiments, the wafer is moved to a number of different z-positions with respect to the focal plane of the inspection system to image different depths of the wafer stack. In some other embodiments, the position of the focal plane of the inspection system is adjusted optically to a number of different z-positions with respect to the wafer to image different depths of the wafer stack. The images collected at each z-position are aggregated to form a three dimensional volume image of a thick semiconductor structure measured in two lateral dimensions (e.g., parallel to the wafer surface) and a number of different depths (i.e., different z-positions).

In general, the optical subsystem 140, including both the illumination and collection subsystems, generates a focused optical image at each of a plurality of focus planes located at a plurality of different depths of a structure under measurement (e.g., a vertically stacked structure). The alignment of the focus plane of the optical subsystem at each different depth is achieved by optical adjustment that moves the focus plane in the z-direction, specimen positioning in the z-direction, or both. One or more detectors detect the light collected at each of the plurality of different depths and generate a plurality of output signals indicative of the amount of light collected at each of the plurality of different depths.

Figure 4:
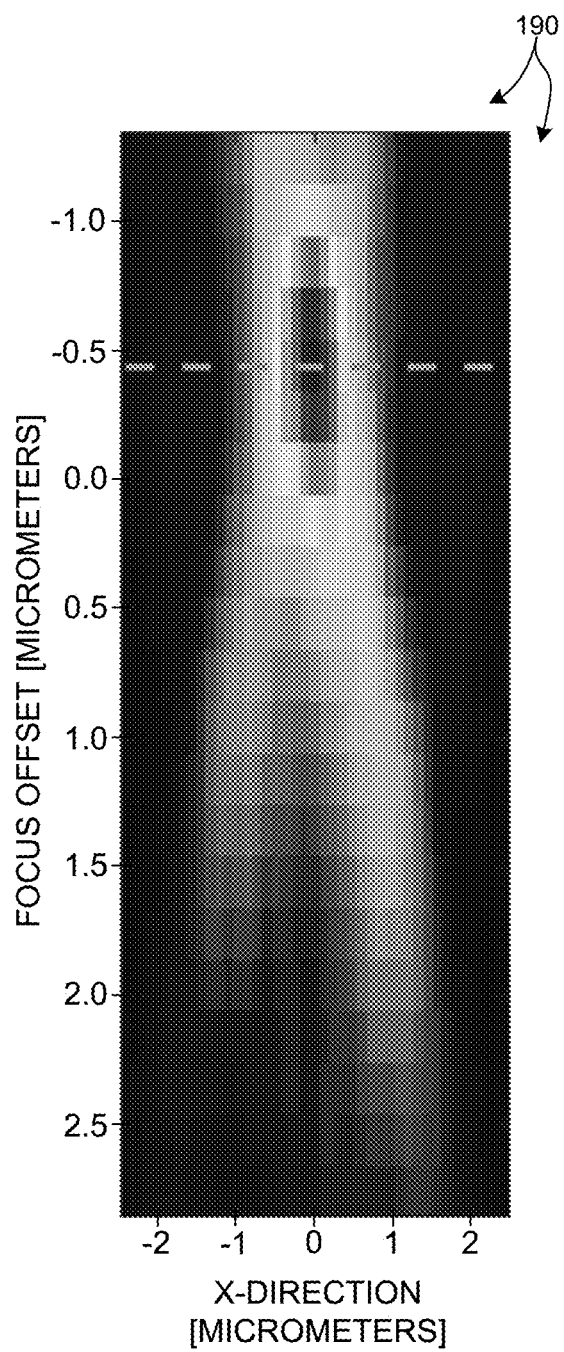
FIG. 4 depicts a plot 190 of a cross-sectional view of a measured three dimensional image illustrating a peak signal near a focus offset of −0.5 micrometers.
Figure 5:
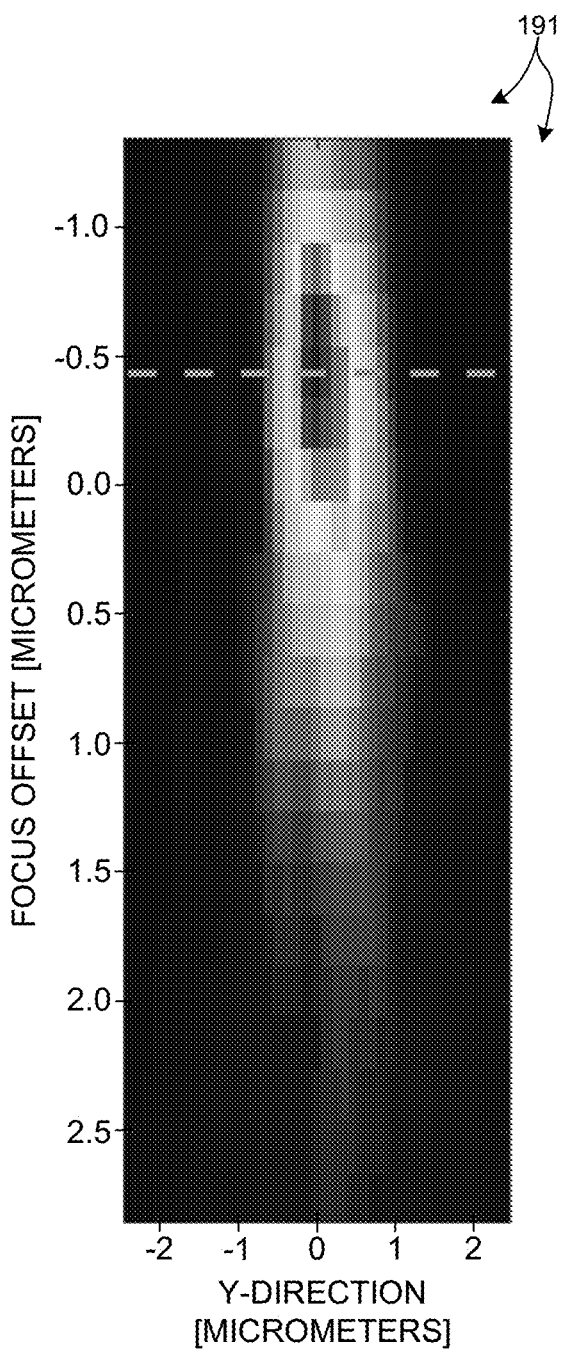
FIG. 5 depicts a plot 191 of another cross-sectional view of the measured three dimensional image also illustrating a peak signal near a focus offset of −0.5 micrometers.

Optical inspection system 100 generates three dimensional images of a thick semiconductor structure from a volume measured in two lateral dimensions (e.g., parallel to the wafer surface) and a depth dimension (e.g., normal to the wafer surface). In the embodiment depicted in FIG. 2, computing system 130 arranges the outputs from one or more of the measurement channels (e.g., from one or more of detectors 115, 120, and 125) into a volumetric data set that corresponds to the measured volume. FIG. 4 depicts a plot 190 of a cross-sectional view (y=0) of a measured three dimensional image illustrating a peak signal near a focus offset of −0.5 micrometers. FIG. 5 depicts a plot 191 of another cross-sectional view (x=0) of the measured three dimensional image also illustrating a peak signal near a focus offset of −0.5 micrometers.

In a defect review example, a series of images are acquired at the same (x,y) location for a number of different wafer locations within the focal plane of the inspection system. In this example, computing system 130 generates a three-dimensional image of the measured volume by assembling a stack of the series of two-dimensional images acquired at each different focus offset. Focus offset is the relative distance between the most reflective surface of the specimen and the focal plane of the inspection system. In general, the parameter to be scanned is not limited to the focus offset. In other examples, sensor axial position, spectral band, illumination direction, etc., can be scanned to form a three-dimensional defect image. In some embodiments, a defect image having more than three dimensions is generated by computing system 130. In one example, both focus offset and illumination direction are scanned for a given (x,y) location. In one example, computing system 130 generates a four dimensional image of the measured volume by assembling the series of two-dimensional images acquired at each different focus offset and each different illumination angle into a fourth order tensor. In some examples, a series of images for a predefined set of focus offsets is collected while keeping illumination intensity and other system parameters unchanged.

In an inspection example, a series of images are acquired at various (x,y) locations for a number of different wafer locations within the focal plane of the inspection system. To generate three dimensional images, image misalignment between different focus offsets must be minimized. In some examples, this is achieved by collecting data with the wafer stage accurately positioned for different depth measurements. However, this approach may significantly reduce throughput. In some other examples, images corresponding to the same lateral positions at different focus offsets are aligned after data collection using alignment targets.

In general, defects are detected from three dimensional images by applying a defect detection algorithm. In some embodiments, defect detection is performed directly from image data generated by inspection system 100. In some embodiments, one or more feature vectors are extracted from the collected image data and defect detection is performed based on the measured feature vectors. In general, a feature vector is an n-dimensional vector of numerical features that represent an object (e.g., defect of interest, nominal structure, etc.). In some examples, a defect detection algorithm includes one or more selectable threshold values that adjust the sensitivity of the defect detection algorithm. When highly restrictive threshold values are selected, the defect detection algorithm detects fewer defects of interest from a set of three dimensional images. When highly permissive threshold values are selected, the defect detection algorithm detects more defects of interest from the same set of three dimensional images. It is likely that real defects will be missed if too few defects are detected, and many nuisance (e.g., false) defects will be captured if too many defects are detected. Thus, an optimized measurement recipe tuned to a particular measurement application also includes a selection of detection algorithm threshold values that maximizes the capture rate of real defects, while minimizing the capture rate of nuisance (i.e., false) defects.

As described with respect to FIG. 2, computing system 130 generates and communicates command signals 122A-G such that illumination power, illumination apertures, collection apertures, spectral band, Fourier filters, illumination polarization, collection polarization, or any combination thereof, are selected in accordance with a specified optical mode. In addition, an inspection system such as inspection system 100 includes other selectable optical system settings such as angle of incidence, azimuth angle, etc. Each distinct combination of optical system settings is referred to as a distinct optical mode of the optical inspection system 100.

In practice, an inspection system, such as inspection system 100 described herein, offers over 10,000 different optical modes, and one mode from thousands of possible modes must be selected to achieve one or more performance objectives. Exemplary performance objectives include, but are not limited to minimizing the response of the nominal structure in the three dimensional image, enhancing the response of the defect signal in the three dimensional image, minimizing the response of wafer noise or nuisance signals in the three dimensional image, discriminating the response of the defect from wafer noise or the nuisance signals in three dimensional images, improving the accuracy of estimated physical location of the defect from the three dimensional image, any combination thereof. Thus, an optimized measurement recipe for a particular measurement application includes a selection of the optimal optical mode.

As described hereinbefore, measurement recipe optimization for a three dimensional optical inspection system such as inspection system 100 includes a selection of an optimal optical mode from thousands of possible system configurations and a selection of detection thresholds. The fact that DOIs may be present throughout the depth of a three dimensional semiconductor structure presents significant practical challenges for defect discovery and recipe optimization because the amount of available image data is so vast (i.e., three dimensional images, not just two dimensional images) and defect verification is so time consuming (i.e., wafer de-processing is required to verify defects).

In one aspect, the three dimensional volume of a semiconductor wafer subject to defect discovery and verification is reduced by storing images associated with a subset of the total depth of the semiconductor structures under measurement. In this manner, the amount of image data that must be collected and analyzed as part of the measurement recipe optimization process is reduced.

In the embodiment depicted in FIG. 2, information about the measurement application 136 under consideration is received by computing system 130 from a user input source 135. Typically, the user input source 135 is an entity such as a user or operator having knowledge of the structures under inspection and expected defects. By way of non-limiting example, structural information 136 includes expected stack depth of defect of interest, wafer level signature of defect of interest, refractive index of the 3-D stack, etc. In one embodiment, inspection system 100 includes peripheral devices useful to accept inputs from an operator (e.g., keyboard, mouse, touchscreen, communication ports, etc.) to communicate structural information 136 from the user to inspection system 100.

A user also communicates an initial set of optical modes for inspection system 100. A user of inspection system 100 typically performs preliminary modeling or employs past experience to arrive at an initial set of optical modes of inspection system 100, which are most likely to result in the best inspection results. Typically, an initial set of optical modes includes tens of different optical modes, but far fewer than the thousands of available optical modes. In some examples, a user also communicates one or more initial focus levels to inspection system 100. The one or more initial focus levels include focus levels where defects of interest should be located.

In response to user inputs 136 and 137, inspection system 100 performs an inspection of wafer 103 at each of the initial set of optical modes and at each of the one or more initial focus levels. Typically, the inspections are run in a scanning mode, where a large area of the wafer (e.g., the entire area of the wafer) is inspected at each of the one or more initial focus levels. Threshold values of the defect detection algorithm employed during the initial inspections set at highly permissive values that identify many defects (i.e., both real and nuisance defects).

After performing the initial inspections, computing system 130 selects a few of the most promising defects identified in the initial inspections. The most promising defects are defects of interest that most closely match the expected defects provided by the user of inspection system 100. Inspection system 100 performs a through focus review of the selected defects of interest by locating the wafer 103 with respect to optical inspection subsystem 140 such that a selected defect of interest is in the field of view of inspection system 100. A series of measurements are performed at a number of focus levels all the way through the structure under measurement. Based on the results of the through focus review, computing system 130 determines one or more focus planes or focus range that best capture the defect of interest. In some examples, the one or more focus planes or focus range is determined based on a best match between a measured defect signature (e.g., image or feature vector) and an expected defect signature.

After determining the one or more focus planes or focus range, inspection system 100 records image patches (e.g., 32×32 pixel patches) associated with defect locations identified in each of the initial inspections at the one or more focus planes or focus range, rather than throughout the entire depth of the structure. In some examples, one hundred million defect locations, or more, are imaged at multiple focus levels, and recorded. In this manner, the amount of recorded data associated with defect discovery is limited to a subset of depths. The recorded data are employed during subsequent defect verification and recipe optimization processes. By limiting the amount of recorded data, subsequent defect verification and recipe optimization processes are dramatically simplified.

In a further aspect, the number of optical modes under consideration is reduced based on a comparison of one or more measured wafer level defect signatures and one or more expected wafer level defect signatures. In one example, after performing the initial inspections, computing system 130 selects a few of the most promising optical modes for further consideration (e.g., five or fewer optical modes). In one example, computing system 130 varies defect detection algorithm threshold values for each optical inspection mode. Computing system 130 varies the threshold values to best match a measured wafer level defect signature with an expected wafer level defect signature for each optical mode. In one example, a wafer level defect signature is a wafer defect map that illustrates regions of the wafer area where defects are more highly or less highly concentrated. In general, a wafer level defect signature includes any indication of wafer defects expressed across the entire wafer area under inspection.

The optical modes that best match the expected defect signature are selected for further consideration, and the other optical modes are discarded. In this manner, the number of modes selected for recording, as described hereinbefore, is reduced. Thus the amount of inspection data under consideration during subsequent defect verification and recipe optimization processes is further reduced. In some examples, five or fewer optical modes are selected for further consideration based on wafer level signature analysis.

In another further aspect, the number of optical modes under consideration is reduced based on measured defect signal to noise ratio. In one example, after performing the initial inspections and wafer level signature matching, computing system 130 further selects a few of the most promising optical modes for further consideration (e.g., three or fewer optical modes). In one example, computing system 130 analyzes the signal to noise ratio associated with each selected optical mode at the one or more focus planes or focus levels. Computing system 130 selects the optical modes with the highest signal to noise ratio for further consideration, and the other optical modes are discarded. In this manner, the number of modes selected for recording, as described hereinbefore, is reduced. Thus the amount of inspection data under consideration during subsequent defect verification and recipe optimization processes is further reduced. In some examples, three or fewer optical modes are selected for further consideration based on wafer level signature analysis.

In another further aspect, the number of optical modes under consideration is reduced based on SEM review of defects without de-processing. In one example, after performing the initial inspections and wafer level signature matching, computing system 130 further selects a few of the most promising optical modes for SEM review without de-processing of the wafer. In one example, wafer 103 is transferred to a SEM review tool, and SEM review measurements are performed to verify defects of interest at the surface or even slightly below the surface. In one example, high energy SEM is utilized to review defects buried within a structure under consideration (e.g., depths up to one micrometer). Although, in general, SEM is not suitable for defect verification of defects at significant depths (e.g., beyond one micrometer). Computing system 130 receives an indication of defects verified by the SEM review tool and selects the optical modes with the highest capture rates of verified defects, and the fewest capture rate of nuisance defects, for further consideration. Other optical modes are discarded. In this manner, the number of modes selected for recording, as described hereinbefore, is reduced. Thus the amount of inspection data under consideration during subsequent defect verification and recipe optimization processes is further reduced. In some examples, three or fewer optical modes are selected for further consideration based on wafer level signature analysis.

In another aspect, verified defect images/features are mapped to corresponding defects identified by inspection system 100. The verified defects and the recorded three dimensional images are employed to train a nuisance filter and optimize the measurement recipe.

Figure 3:
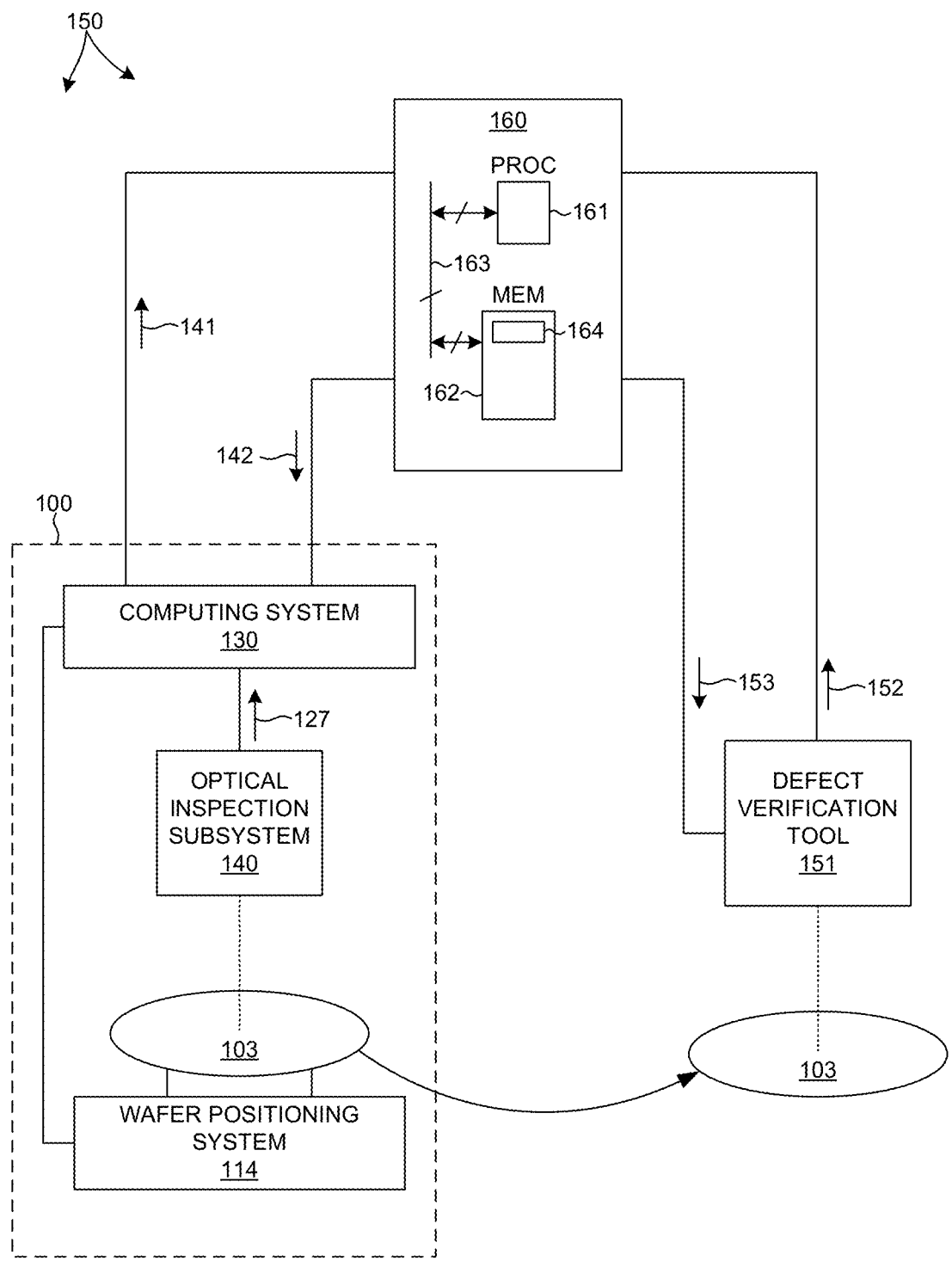
FIG. 3 is a simplified schematic view of one embodiment of a system configured to optimize a three dimensional nuisance filter and a measurement recipe for a particular measurement application.

FIG. 3 is a simplified schematic view of one embodiment of a system 150 for defect discovery and measurement recipe optimization for inspection of three dimensional semiconductor structures. The system 150 includes inspection system 100 as described with reference to FIG. 2, a defect verification tool 151, and a computing system 160. In some embodiments, the task performed by computing system 160 are as described herein are implemented by computing system 130, or another computing system.

In some embodiments, defect verification tool 151 is an electron beam based analysis tool. In some other embodiments, defect verification tool 151 is an x-ray based analysis tool. In these embodiments, a material removal tool may not be necessary to make the buried defect visible to the x-ray based analysis tool. Thus, an associated material removal tool is optional.

In some examples, defect verification is achieved by de-processing wafer 103 and inspecting the exposed defects with inspection system 100. In these examples, a different defect verification tool 151 may not be required. In some embodiments, a defect verification tool, such as a SEM review tool may be integrated with inspection system 100 as a single wafer processing tool, or, alternatively, separated into different wafer processing systems individually, or in any combination.

Computing system 130 coordinates the inspection processes, and performs analyses, data handling, and communication tasks. Similarly, computing system 160 coordinates the material removal and review processes, performs analyses, and performs data handling and communication tasks.

Defect verification can be accomplished in many different ways. In some embodiments, voltage contrast inspection is performed to verify defects. In these embodiments, a wafer is decorated in accordance with a small sample plan and voltage contrast measurements are performed on the decorated wafer by a voltage contrast inspection tool.

In some other embodiments, wafer fabrication is completed and a bit-map test is performed on the finished wafer to verify defects.

In some other embodiments, a wafer is de-processed to remove layers of the multiple layer structure under consideration. De-processing may be accomplished by chemical processes, mechanical processes, or both. In on example, a focused ion beam (FIB) tool is employed to remove material from the surface of a wafer. The wafer is de-processed until the buried defects are located at or near the surface of the wafer and can be effectively imaged by defect verification tool 151, e.g., a SEM review tool, inspection system 100, etc. Defect locations and associated defect images 152 associated with defect verification measurements are stored in a memory (e.g., memory 162 on board computing system 160). In some embodiments, the defect information is stored in the form of a KLA results file (KLARF). The KLARF file is a flat ASCII file produced by the defect verification tool 150. The same KLARF file format is used to save defect information from inspection system 100.

In a further aspect, defect information 141 associated with defects identified by inspection system 100 as part of defect discovery is communicated to computing system 160. Computing system 160 samples the identified defects to generate a diversity set of DOIs 153 communicated to defect verification tool 151. In some embodiments, computing system 160 bins the defects identified by inspection system 100 during defect discovery (e.g., 100 million or more DOIs) and selects a few defects from each bin to generate the diversity set of DOIs 153. The diversity set of DOIs 153 are saved in a memory (e.g., memory 162 on board computing system 160).

Defect verification measurements are performed on the diversity set of DOIs. The defect locations and associated defect images from the defect verification measurements are stored in a memory (e.g., memory 162 on board computing system 160). In some embodiments, defect information associated with the diversity set of DOIs is also stored in a KLARF file format.

Defect verification data from the diversity set of DOIs, any other set of verified defects, or a combination thereof, are mapped to the saved through focus defect image patches and corresponding feature vectors. The defect verification data and the corresponding through focus defect image patches and corresponding feature vectors are employed to train a nuisance elimination filter.

In one example, computing system 160 trains a through focus image based machine learning network to filter out nuisance defects. In some of these examples, the machine learning network is trained based on defect images. By way of non-limiting example, a suitable machine learning network is implemented as a neural network, a support vector machines model, a decision tree model, etc.

In another example, computing system 160 trains a through focus feature based automated classifier to filter out nuisance defects. In some of these examples, the automated classifier is feature based, rather than image based. By way of non-limiting example, a suitable through focus feature based automated classifier is implemented as a trained random forest algorithm, etc.

In another example, computing system 160 implements a rule based tree classifier to filter out nuisance defects. In some of these examples, the rule based tree classifier is feature based, rather than image based. By way of non-limiting example, a suitable rule based tree classifier is implemented based on manually generated rules.

The trained nuisance elimination filter 142 is communicated to inspection system 100 and applied to the saved defect images associated with each optics mode under consideration. In this manner, defect detection is emulated using the through focus defect events recorded during defect discovery. Detection threshold values associated with each optical mode are adjusted to achieve a desirable nuisance rate. In one example, the detection threshold values associated with each optical mode are adjusted to achieve a nuisance rate of approximately 30%, and the optical mode that achieves the best defect signature matching and real defect capture rate is selected for implementation as the production measurement recipe for the measurement application under consideration. In the embodiment depicted in FIG. 3, inspection system 100 implements nuisance filter 142 and the selected production measurement recipe to identify and classify defects based on an analysis of three dimensional images of thick semiconductor structures in a production setting.

In general, a three-dimensional image is processed algorithmically to identify and classify defects of interest. In some examples, processor 131 is configured to detect and classify defects from a three-dimensional image. The processor may include any appropriate processor known in the art. In addition, the processor may be configured to use any appropriate defect detection and classification algorithm or method known in the art. For example, the processor may use a die-to-database comparison, a three-dimensional filter, a clustering algorithm such as a principal component analysis or spectral clustering, a thresholding algorithm, a deep learning algorithm, or any other suitable algorithm to detect and classify defects on the specimen.

In another aspect, the three dimensional location of a defect of interest is determined based on an analysis of the three dimensional image of a thick semiconductor structure. In this manner, the actual position of a defect within a wafer is measured (e.g., $\{x,y,z\}$ coordinates of the defect). The actual defect position can be used to locate the defect later for further analysis (e.g., analysis by a focused ion beam system, EBI system, etc.).

In some examples, the x-position, y-position, and focus offset associated with the peak defect signal within the 3D image is used to evaluate the actual defect position within the wafer structure (e.g., 3D NAND wafer stack).

In many dark field measurement applications, the diffraction orders are suppressed and the actual defect location in the z-direction (e.g., depth) is linearly related to the focus offset associated with the peak signal. For many cases of incoherent BF illumination the defect location in the z-direction is linearly related to the focus offset associated with the peak signal. In these examples, computing system 130 determines the focus offset associated with the peak and determines the defect depth by multiplying the focus offset by a scaling factor.

In other examples, the actual defect position is determined by comparing the three dimensional image and one or more simulated three-dimensional images of a defect. In one example, computing system 130 performs a rigorous coupled wave analysis (RCWA) to simulate the measured defect response. This analysis may be performed recursively to minimize the error between the measured response and the simulated response and identify and locate the defect.

In some other examples, a measurement library is generated that matches measured data with defect depths (e.g., distance below the wafer surface) measured by a trusted reference measurement system. In one example, the trusted reference measurement system is a defect review performed after focus ion beam etching of a specimen under consideration. Once the library is generated, defect locations associated with subsequent measurements are estimated based on library matching.

In a further aspect, the three dimensional image is filtered before defect analysis to improve SNR. In some examples, computing system analyzes the assembled three-dimensional image with a 3D digital filter, or other suitable numerical technique to detect unique three-dimensional structures arising from defects. This effectively increases the SNR of the defects and enables more effective separation of defects of interest from noise or nuisance effects.

In general, computing systems 130 and 160 are configured to detect and classify defects based on through focus images or feature vectors. Computing systems 130 and 160 may include any appropriate processor(s) known in the art. In addition, computing systems 130 and 160 may be configured to use any appropriate defect detection algorithm or method known in the art. For example, computing systems 130 and 160 may use a die-to-database comparison or a thresholding algorithm to detect defects on the specimen.

In addition, inspection system 100 may include peripheral devices useful to accept inputs from an operator (e.g., keyboard, mouse, touchscreen, etc.) and display outputs to the operator (e.g., display monitor). Input commands from an operator may be used by computing system 130 to adjust threshold values used to control illumination power. The resulting power levels may be graphically presented to an operator on a display monitor.

Inspection system 100 includes a processor 131 and an amount of computer readable memory 132. Processor 131 and memory 132 may communicate over bus 133. Memory 132 includes an amount of memory 134 that stores an amount of program code that, when executed by processor 131, causes processor 131 to execute the defect detection, classification, and depth estimation functionality described herein.

System 150 includes a processor 161 and an amount of computer readable memory 162. Processor 161 and memory 162 may communicate over bus 163. Memory 162 includes an amount of memory 164 that stores an amount of program code that, when executed by processor 161, causes processor 161 to execute the defect detection, classification, and depth estimation functionality described herein.

Figure 6:
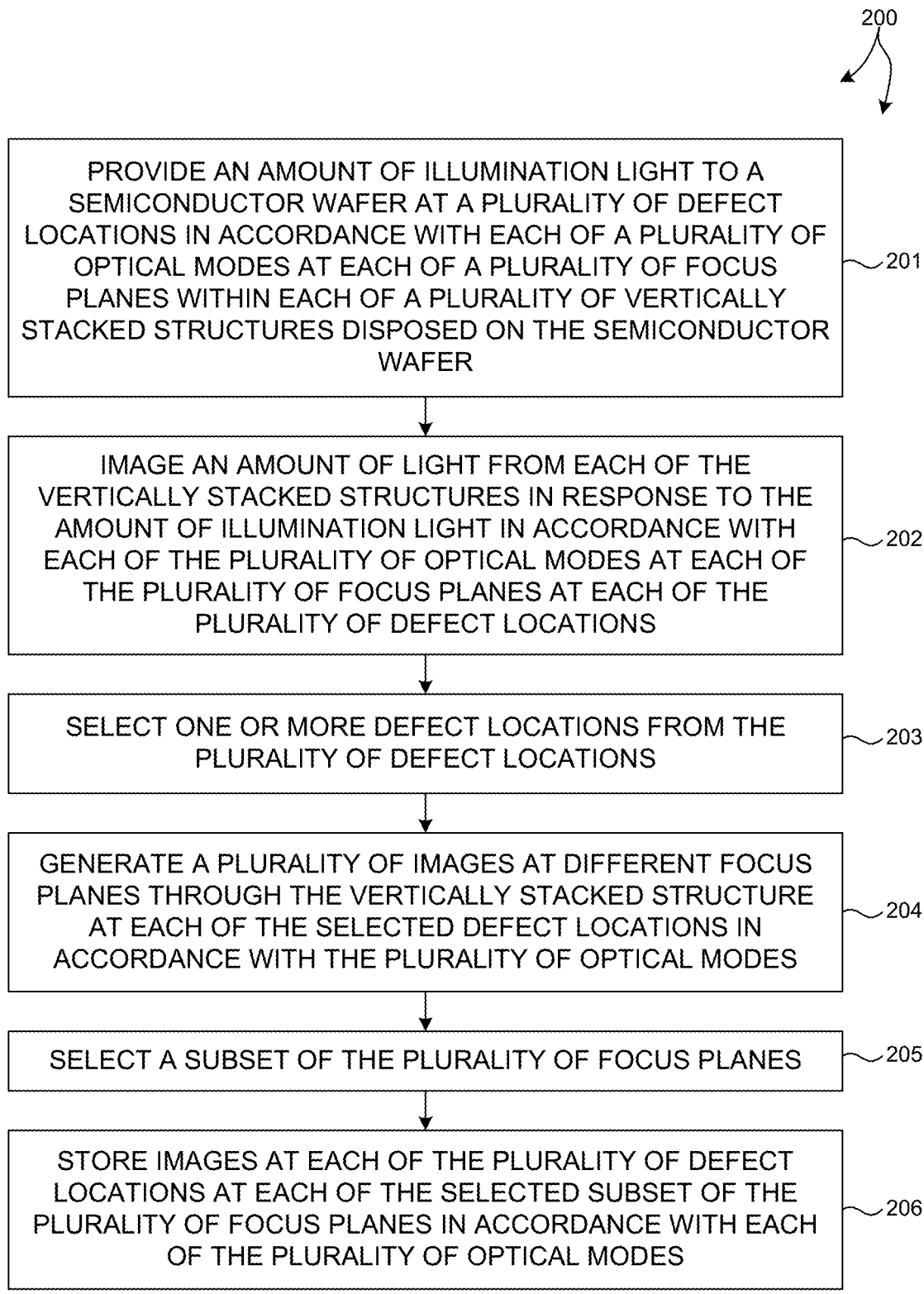
FIG. 6 illustrates a flowchart of an exemplary method 200 useful for detecting defects based on 3-D images of thick structures.

FIG. 6 illustrates a flowchart of an exemplary method 200 useful for detecting defects based on 3-D images of thick structures. In some non-limiting examples, inspection system 100 described with reference to FIG. 2 is configured to implement method 200. However, in general, the implementation of method 200 is not limited by the specific embodiments described herein.

In block 201, an amount of illumination light is provided to a semiconductor wafer at a plurality of defect locations in accordance with each of a plurality of optical modes at each of a plurality of focus planes within each of a plurality of vertically stacked structures disposed on the semiconductor wafer.

In block 202, an amount of light is imaged from each of the vertically stacked structures in response to the amount of illumination light in accordance with each of the plurality of optical modes at each of the plurality of focus planes at each of the plurality of defect locations.

In block 203, one or more defect locations are selected from the plurality of defect locations.

In block 204, a plurality of images are generated at different focus planes through the vertically stacked structure at each of the selected defect locations in accordance with the plurality of optical modes.

In block 205, a subset of the plurality of focus planes is selected for storage.

In block 206, images at each of the plurality of defect locations at each of the selected subset of the plurality of focus planes in accordance with each of the optical modes are stored.

In general, the three dimensional imaging techniques described herein can be applied during research and development, production ramp, and high volume production phases of manufacture of semiconductor devices, and is applicable to any optical, image-based measurement technique. In addition, these techniques may be applied to optical and x-ray inspection modalities.

Regardless of the particular type of fabrication process, defects need to be detected in all levels of a multiple layer stack and as early as possible in the particular process. Certain inspection embodiments preferably include detection of defects throughout a stack, including the stack surface and throughout the various depths of a stack. For example, certain embodiments allow defects to be found at depths of up to about three micrometers. In another embodiment, defects can be detected at stack depths that are as large as about eight micrometers. The thickness of a vertical ONON or OPOP stack under inspection is limited only by the depth of penetration of the illumination light. Transmission through an oxide-nitride-oxide-nitrite (ONON) or oxide-polysilicon-oxide-polysilicon (OPOP) stack is limited less by absorption at longer wavelengths. Thus, longer illumination wavelengths may be employed to effectively inspect very deep structures.

The three dimensional imaging techniques described herein can be applied to complex, vertically stacked structures, including, but not limited to 3D negative-AND (NAND) gate memory devices. Although inspection systems and techniques are described herein as being applied to certain types of vertical NAND (VNAND) memory structures, it is understood that embodiments of the present invention may be applied to any suitable 3D or vertical semiconductor structures, such as NAND or NOR memory devices formed using terabit cell array transistors (TCAT), vertical-stacked array transistors (VSAT), bit cost scalable technology (BiCST), piped shaped BiCS technology (P-BiCS), etc. The vertical direction is generally a direction that is perpendicular to the substrate surface. Additionally, although particular fabrication steps, processes, and materials are described for forming such 3D structures, inspection embodiments may be applied at any point in the fabrication flow that results in multiple layers being formed on a substrate, and such layers may include any number and type of materials.

Various embodiments are described herein for an inspection system or tool that may be used for inspecting a specimen. The term "specimen" is used herein to refer to a wafer, a reticle, or any other sample that may be inspected for defects, features, or other information (e.g., an amount of haze or film properties) known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as quartz. A reticle may be disposed above a resist-covered wafer during an exposure step of a lithography process such that the pattern on the reticle may be transferred to the resist.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. In one example, a detector may include a fiber array. In one example, inspection system 100 may include more than one light source (not shown). The light sources may be configured differently or the same. For example, the light sources may be configured to generate light having different characteristics that can be directed to a wafer at the same or different illumination areas at the same or different angles of incidence at the same or different times. The light sources may be configured according to any of the embodiments described herein. In addition one of the light sources may be configured according to any of the embodiments described herein, and another light source may be any other light source known in the art. In some embodiments, an inspection system may illuminate the wafer over more than one illumination area simultaneously. The multiple illumination areas may spatially overlap. The multiple illumination areas may be spatially distinct. In some embodiments, an inspection system may illuminate the wafer over more than one illumination area at different times. The different illumination areas may temporally overlap (i.e., simultaneously illuminated over some period of time). The different illumination areas may be temporally distinct. In general, the number of illumination areas may be arbitrary, and each illumination area may be of equal or different size, orientation, and angle of incidence. In yet another example, inspection system 100 may be a scanning spot system with one or more illumination areas that scan independently from any motion of wafer 103. In some embodiments an illumination area is made to scan in a repeated pattern along a scan line. The scan line may or may not align with the scan motion of wafer 103. Although as presented herein, wafer positioning system 114 generates motion of wafer 103 by coordinated rotational and translational movements, in yet another example, wafer positioning system 114 may generate motion of wafer 103 by coordinating two translational movements. For example, wafer positioning system 114 may generate motion along two orthogonal, linear axes (e.g., X-Y motion).

Accordingly, various modifications, adaptations, and combinations of various features of the described embodiments can be practiced without departing from the scope of the invention as set forth in the claims.

What is claimed is:

1. A method comprising:
providing an amount of illumination light to a semiconductor wafer at a plurality of defect locations in accordance with each of a plurality of optical modes at each of a plurality of focus planes within each of a plurality of vertically stacked structures disposed on the semiconductor wafer;
imaging an amount of light from each of the vertically stacked structures in response to the amount of illumination light in accordance with each of the plurality of optical modes at each of the plurality of focus planes at each of the plurality of defect locations;
selecting one or more defect locations from the plurality of defect locations;
generating a plurality of images at different focus planes among the plurality of focus planes through the vertically stacked structure at each of the selected defect locations in accordance with the plurality of optical modes;
selecting a subset of the plurality of focus planes for further defect inspection at the selected defect locations based on a measured defect signature in the plurality of generated images or defect locations within the plurality of focus planes, wherein the subset of the plurality of focus planes includes fewer focus planes than the plurality of focus planes and excludes at least some of the plurality of focus planes; and
storing images at each of the selected defect locations at each of the selected subset of the plurality of focus planes in accordance with each of the plurality of optical modes for further defect analysis.

2. The method of claim 1, further comprising:
adjusting one or more parameter values of a defect detection algorithm associated with each of the plurality of optical modes to fit a wafer level signature measured at each of the plurality of optical modes to an expected wafer level signature;
selecting a subset of the plurality of optical modes for further consideration based on a goodness of the fit associated with each of the plurality of optical modes.

3. The method of claim 1, further comprising:
estimating a signal to noise ratio associated with each of the plurality of optical modes; and
selecting a subset of the plurality of optical modes for further consideration based on the estimated signal to noise ratio associated with each of the plurality of optical modes.

4. The method of claim 1, further comprising:
performing a scanning electron microscopy (SEM) measurement at one or more of the selected defect locations without de-processing the semiconductor wafer; and
selecting a subset of the plurality of optical modes for further consideration based on the SEM measurements.

5. The method of claim 1, further comprising:
verifying one or more defects buried within one or more of the plurality of vertically stacked structures disposed on the semiconductor wafer;
mapping each of the verified defects to corresponding images of defect locations at each of the selected subset of the plurality of focus planes in accordance with each of the plurality of optical modes; and
training a three dimensional nuisance filter to filter out nuisance defects based on the verified defects and the corresponding images.

6. The method of claim 5, wherein the training is based on images of the verified defects and the corresponding images or feature vectors associated with the verified defects and feature vectors associated with the corresponding images.

7. The method of claim 5, wherein the training involves training a machine learning network to filter out nuisance defects.

8. The method of claim 5, wherein the training involves training a through focus feature based automatic classifier.

9. The method of claim 5, wherein the training involves training a rule based tree classifier based on manually generated rules.

10. The method of claim 5, further comprising:
filtering each of the images at each of the plurality of defect locations at each of the selected subset of the plurality of focus planes in accordance with each of the plurality of optical modes with the trained three dimensional nuisance filter; and
selecting one optical mode from the plurality of optical modes based on a capture rate of real defects and a capture rate of nuisance defects associated with each of the plurality of optical modes.

11. The method of claim 10, wherein the selecting involves adjusting one or more parameter values of a defect detection algorithm associated with each of the plurality of optical modes to achieve a predetermined nuisance capture rate selecting the optical mode that achieves the highest capture rate of real defects for the predetermined nuisance capture rate.

12. The method of claim 5, wherein the verifying of the one or more buried defects involves a voltage contrast inspection of the semiconductor wafer.

13. The method of claim 5, wherein the verifying of the one or more buried defects involves a bit-map test of the semiconductor wafer after complete fabrication of the semiconductor wafer.

14. The method of claim 5, wherein the verifying of the one or more buried defects involves de-processing of the semiconductor wafer and review by a scanning electron microscope (SEM).

15. The method of claim 5, wherein a location of each of the verified defects is stored in a KLA Results File (KLARF) file format.

16. The method of claim 5, further comprising:
binning the images at each of the plurality of defect locations at each of the selected subset of the plurality of focus planes in accordance with each of the plurality of optical modes into a plurality of bins; and
selecting one or more of the plurality of defect locations from each of the plurality of bins to generate a diversity set of buried defects, wherein the one or more defects subject to verification includes the diversity set of buried defects.

17. A system comprising:
an illumination source that provides an amount of illumination light directed to a semiconductor wafer at a plurality of defect locations in accordance with each of a plurality of optical modes at each of a plurality of focus planes within each of a plurality of vertically stacked structures disposed on the semiconductor wafer;
a photodetector that generates a plurality of output signals indicative of an amount of light imaged from each of the vertically stacked structures in accordance with each of the plurality of optical modes at each of the plurality of focus planes at each of the plurality of defect locations; and
a computing system, including one or more processors and an amount of computer readable memory, configured to:
select one or more defect locations from the plurality of defect locations;
generate a plurality of images at different focus planes among the plurality of focus planes through the vertically stacked structure at each of the selected defect locations in accordance with the plurality of optical modes;
select a subset of the plurality of focus planes for further defect inspection at the selected defect locations based on a measured defect signature in the plurality of generated images or defect locations within the plurality of focus planes, wherein the subset of the plurality of focus planes includes fewer focus planes than the plurality of focus planes and excludes at least some of the plurality of focus planes; and
store images at each of the selected defect locations at each of the selected subset of the plurality of focus planes in accordance with each of the plurality of optical modes for further defect analysis.

18. The system of claim 17, wherein the computing system is further configured to:
adjust one or more parameter values of a defect detection algorithm associated with each of the plurality of optical modes to fit a wafer level signature measured at each of the plurality of optical modes to an expected wafer level signature; and
select a subset of the plurality of optical modes for further consideration based on a goodness of the fit associated with each of the plurality of optical modes.

19. The system of claim 17, wherein the computing system is further configured to:
estimate a signal to noise ratio associated with each of the plurality of optical modes; and
select a subset of the plurality of optical modes for further consideration based on the estimated signal to noise ratio associated with each of the plurality of optical modes.

20. The system of claim 17, further comprising:
a scanning electron microscopy (SEM) configured to perform a measurement at one or more of the selected defect locations without de-processing the semiconductor wafer, and wherein the computing system is further configured to select a subset of the plurality of optical modes for further consideration based on the SEM measurements.

21. The system of claim 17, further comprising:
a defect verification system configured to verify one or more defects buried within one or more of the plurality of vertically stacked structures disposed on the semiconductor wafer, wherein the computing system is further configured to:
map each of the verified defects to corresponding images of defect locations at each of the selected subset of the plurality of focus planes in accordance with each of the plurality of optical modes; and
train a three dimensional nuisance filter to filter out nuisance defects based on the verified defects and the corresponding images.

22. A system comprising:
an illumination source that provides an amount of illumination light directed to a semiconductor wafer at a plurality of defect locations in accordance with each of a plurality of optical modes at each of a plurality of focus planes within each of a plurality of vertically stacked structures disposed on the semiconductor wafer;
a photodetector that generates a plurality of output signals indicative of an amount of light imaged from each of the vertically stacked structures in accordance with each of the plurality of optical modes at each of the plurality of focus planes at each of the plurality of defect locations; and a computing system comprising:
  one or more processors; and
  a non-transitory, computer-readable medium storing instructions, that when executed by the one or more processors, cause the computing system to:
    select one or more defect locations from the plurality of defect locations;
    generate a plurality of images at different focus planes among the plurality of focus planes through the vertically stacked structure at each of the selected defect locations in accordance with the plurality of optical modes;
    select a subset of the plurality of focus planes for further defect inspection at the selected defect locations based on a measured defect signature in the plurality of generated images or defect locations within the plurality of focus planes, wherein the subset of the plurality of focus planes includes fewer focus planes than the plurality of focus planes and excludes at least some of the plurality of focus planes; and
    store images at each of the selected defect locations at each of the selected subset of the plurality of focus planes in accordance with each of the plurality of optical modes for further defect analysis.

23. The system of claim 22, the non-transitory, computer-readable medium further storing instructions, that when executed by the one or more processors, cause the computing system to:
  adjust one or more parameter values of a defect detection algorithm associated with each of the plurality of optical modes to fit a wafer level signature measured at each of the plurality of optical modes to an expected wafer level signature; and
  select a subset of the plurality of optical modes for further consideration based on a goodness of the fit associated with each of the plurality of optical modes.

24. The system of claim 22, the non-transitory, computer-readable medium further storing instructions, that when executed by the one or more processors, cause the computing system to:
  estimate a signal to noise ratio associated with each of the plurality of optical modes; and
  select a subset of the plurality of optical modes for further consideration based on the estimated signal to noise ratio associated with each of the plurality of optical modes.

25. The system of claim 22, further comprising:
  a scanning electron microscopy (SEM) configured to perform a measurement at one or more of the selected defect locations without de-processing the semiconductor wafer, the non-transitory, computer-readable medium further storing instructions, that when executed by the one or more processors, cause the computing system to select a subset of the plurality of optical modes for further consideration based on the SEM measurements.

26. The system of claim 22, further comprising:
  a defect verification system configured to verify one or more defects buried within one or more of the plurality of vertically stacked structures disposed on the semiconductor wafer, the non-transitory, computer-readable medium further storing instructions, that when executed by the one or more processors, cause the computing system to:
    map each of the verified defects to corresponding images of defect locations at each of the selected subset of the plurality of focus planes in accordance with each of the plurality of optical modes; and
  train a three dimensional nuisance filter to filter out nuisance defects based on the verified defects and the corresponding images.

* * * * *